(12) United States Patent
Holden et al.

(10) Patent No.: US 11,195,756 B2
(45) Date of Patent: Dec. 7, 2021

(54) PROXIMITY CONTACT COVER RING FOR PLASMA DICING

(71) Applicant: APPLIED MATERIALS, INC., Santa Clara, CA (US)

(72) Inventors: James M. Holden, San Jose, CA (US); Alexander N. Lerner, San Jose, CA (US); Ajay Kumar, Cupertino, CA (US); Aparna Iyer, Sunnyvale, CA (US); Alan Hiroshi Ouye, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/491,856

(22) Filed: Sep. 19, 2014

(65) Prior Publication Data

US 2016/0086852 A1    Mar. 24, 2016

(51) Int. Cl.
| | | |
|---|---|---|
| *H01J 37/32* | (2006.01) | |
| *H01L 21/78* | (2006.01) | |
| *H01L 21/67* | (2006.01) | |
| *H01L 21/683* | (2006.01) | |
| *H01L 21/3065* | (2006.01) | |
| *H01L 21/308* | (2006.01) | |

(52) U.S. Cl.
CPC ........ *H01L 21/78* (2013.01); *H01J 37/32366* (2013.01); *H01J 37/32715* (2013.01); *H01L 21/6836* (2013.01); *H01J 2237/334* (2013.01); *H01L 2221/68327* (2013.01); *H01L 2221/68381* (2013.01)

(58) Field of Classification Search
USPC .................. 118/715–732; 156/345.51–345.55
See application file for complete search history.

(56) References Cited

U.S. PATENT DOCUMENTS

| | | | |
|---|---|---|---|
| 4,049,944 A | 9/1977 | Garvin et al. | |
| 4,339,528 A | 7/1982 | Goldman | |
| 4,684,437 A | 8/1987 | Donelon et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V et al., "Water-Soluble Sacrificial Layers for Surface Micromachining", www.small-journal.com, 2005, 1, No. 7, 7 pgs.

(Continued)

*Primary Examiner* — Karla A Moore
*Assistant Examiner* — Tiffany Z Nuckols
(74) *Attorney, Agent, or Firm* — Schwabe, Williamson & Wyatt, P.C.

(57) ABSTRACT

Methods of and carriers for dicing semiconductor wafers, each wafer having a plurality of integrated circuits, are described. In an example, a cover ring for protecting a carrier and substrate assembly during an etch process includes an inner opening having a diameter smaller than the diameter of a substrate of the carrier and substrate assembly. An outer frame surrounds the inner opening. The outer frame has a bevel for accommodating an outermost portion of the substrate of the carrier and substrate assembly.

8 Claims, 11 Drawing Sheets

(56) References Cited

U.S. PATENT DOCUMENTS

| | | | |
|---|---|---|---|
| 5,316,278 A * | 5/1994 | Sherstinsky | H01L 21/68721 269/254 R |
| 5,326,725 A * | 7/1994 | Sherstinsky | C23C 16/042 118/500 |
| 5,336,638 A | 8/1994 | Suzuki et al. | |
| 5,405,491 A * | 4/1995 | Shahvandi et al. | 438/710 |
| 5,439,524 A * | 8/1995 | Cain | C23C 16/45565 118/715 |
| 5,593,606 A | 1/1997 | Owen et al. | |
| 5,691,794 A | 11/1997 | Hoshi et al. | |
| 5,725,718 A * | 3/1998 | Banholzer et al. | 156/345.51 |
| 6,030,513 A * | 2/2000 | Ghantiwala | H01L 22/34 118/505 |
| 6,051,503 A | 4/2000 | Bhardwaj et al. | |
| 6,057,180 A | 5/2000 | Sun et al. | |
| 6,123,804 A * | 9/2000 | Babassi | H01L 21/68721 156/345.51 |
| 6,123,864 A * | 9/2000 | Tam | H01L 21/68721 156/345.51 |
| 6,162,336 A * | 12/2000 | Lee | C23C 14/50 118/500 |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,555,164 B1 | 4/2003 | Yudovsky | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,886,798 B2 * | 2/2011 | Kubo | H01L 21/67132 156/494 |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,912,075 B1 * | 12/2014 | Lei | H01L 21/6836 257/620 |
| 9,034,771 B1 | 5/2015 | Nangoy | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0005911 A1 * | 1/2006 | Kubo | H01L 21/6836 156/84 |
| 2006/0009010 A1 * | 1/2006 | Nagai | H01L 21/78 438/464 |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2009/0067954 A1 * | 3/2009 | Lanee | H01L 21/68721 414/172 |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0280890 A1 | 10/2013 | Lei et al. | |
| 2014/0017900 A1 | 1/2014 | Doba et al. | |
| 2014/0190513 A1 * | 7/2014 | Lee | H01L 21/67766 134/1.2 |
| 2014/0242780 A1 | 8/2014 | Gauldin et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2014/165182 | 9/2014 |
| JP | 2014/523114 | 9/2014 |
| TW | 200414398 | 8/2004 |
| TW | 2012/46335 | 11/2012 |
| TW | 201250814 | 12/2012 |
| TW | 2013/40201 | 10/2013 |
| TW | 201428814 | 7/2014 |
| WO | WO-03036712 | 5/2003 |
| WO | WO-03071591 | 5/2003 |
| WO | WO 2012/133585 | 7/2014 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Hallahan, Ed, "Polyphenylene sulfide (PPS) in review," printed from the IAPD Magazine, April/May 2004, 3 pages.

Semiconductor Equipment and Materials International (SEMI) Draft Document 4522 and Background Statement for SEMI Draft Document 4522, SEMI International Standards program, Feb. 20, 2008, 5 pages.

Semiconductor Equipment and Materials International (SEMI) G74-0699 (Reapproved 0706) Specification for Tape Frame for 300 mm Wafers, Jun. 2006, 4 pages.

Lei, Wei-Sheng et al., U.S. Appl. No. 14/297,292 entitled "Carrier With Thermally Resistant Film Frame for Supporting Wafer During Singulation" filed Jun. 5, 2014, 48 pgs.

International Search Report and Written Opinion from PCT/US2015/047038 dated Nov. 30, 2015, 11 pgs.

International Preliminary Report on Patentability for PCT Patent Application No. PCT/US2015/047038 dated Mar. 30, 2017, 8 pages.

Chinese Office Action with Search Report from China's State Intellectual Property Office (SIPO) for Chinese Patent Application No. 201580056404.5 dated Apr. 5, 2018, 9 pgs.

Extended European Search Report from European Patent Application No. 15841464.9 dated May 8, 2018, 10 pgs.

Official Letter from Taiwan Patent Application No. 104128461 dated Jan. 28, 2019, 10 pgs.

(56) References Cited

OTHER PUBLICATIONS

Notice of Reasons for Rejection from Japanese Patent Application No. 2017-515746 dated Aug. 6, 2019, 9 pgs.
Official Letter from Taiwan Patent Application No. 108116517, dated Jul. 23, 2019, 5 pgs.
Examination of European Patent Application No. 15841464.9 dated Feb. 8, 2021, 7 pgs.

* cited by examiner

PROXIMITY CONTACT COVER RING FOR PLASMA DICING

BACKGROUND

1) Field

Embodiments of the present invention pertain to the field of semiconductor processing and, in particular, to methods of and carriers for dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of, and apparatuses for, dicing semiconductor wafers.

In an embodiment, a cover ring for protecting a carrier and substrate assembly during an etch process includes an inner opening having a diameter smaller than the diameter of a substrate of the carrier and substrate assembly. An outer frame surrounds the inner opening. The outer frame has a bevel for accommodating an outermost portion of the substrate of the carrier and substrate assembly.

In another embodiment, a method of dicing a semiconductor wafer having a front surface with a plurality of integrated circuits thereon involves providing the semiconductor wafer on a substrate carrier, the semiconductor wafer having a patterned mask covering the integrated circuits and having scribe lines between the integrated circuits. The method also involves situating a cover ring above the semiconductor wafer and substrate carrier. The cover ring has an inner opening with a diameter smaller than the diameter of the semiconductor wafer. The cover ring also has an outer frame surrounding the inner opening. The outer frame has a bevel for accommodating an outermost portion of the semiconductor wafer. The method also involves plasma etching the semiconductor wafer through the scribe lines to singulate the integrated circuits.

In another embodiment, a plasma etch chamber includes a substrate processing region for supporting a carrier and substrate assembly. The plasma etch chamber also includes a cover ring moveably positioned above the substrate processing region. The cover ring is for protecting the carrier and substrate assembly during an etch process. The cover ring includes an inner opening having a diameter smaller than the diameter of a substrate of the carrier and substrate assembly. The cover ring also includes an outer frame surrounding the inner opening, the outer frame having a bevel for accommodating an outermost portion of the substrate of the carrier and substrate assembly during the etch process.

DETAILED DESCRIPTION

Figure 1:
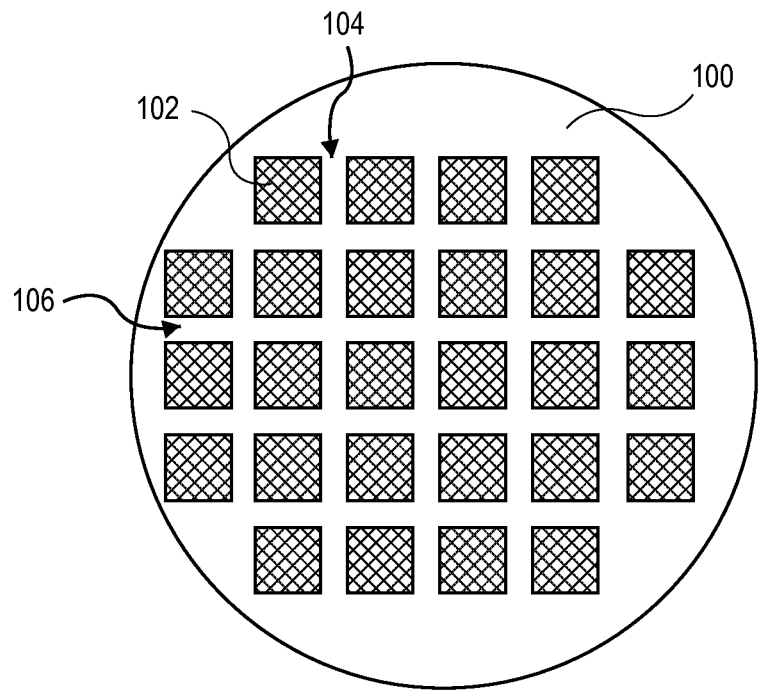
FIG. 1 illustrates a top plan of a semiconductor wafer to be diced, in accordance with an embodiment of the present invention.

Methods of and carriers for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a proximity contact cover ring for plasma dicing applications. One or more embodiments may be manifested in plasma dicing process hardware for use during semiconductor integrated circuit production.

To provide context, after integrated circuit devices have been formed upon a semiconductor substrate, such as a 300 mm silicon wafer, the individual devices must be separated from the semiconductor substrate by a process known as singulation or simply "dicing" where it is said wafers are "diced" into the individual devices called "chips" prior to picking for later processing and packaging into products. Various approaches exist for dicing substrates into chips including scribe and break, mechanical sawing, laser cutting, and plasma dicing. Embodiments described herein may be particularly suitable for plasma dicing processing.

To provide further context, during plasma dicing, a substrate with finished devices on the top side that has been thinned and optionally had metallization applied to the bottom side, is affixed to dicing tape by an adhesive applied to the dicing tape. The dicing tape is affixed to a dicing ring of metal or plastic. The ring supports tape around the perimeter of the wafer. Both the ring and the wafer are attached to the dicing tape from a same side. After the dicing process has been completed, the dicing tape continues to support the diced chips in place where they were diced from the semiconductor substrate. The dicing frame is then delivered to an apparatus that can pick individual dies from the tape. In order to facilitate safe transport with easy die pick, a "UV release dicing tape" is often employed where the adherence of the tape adhesive to the die is reduced when exposed to ultra-violet (UV) light. Typically, after dicing, a picking machine, just prior to die pick, would expose only the portion of UV release dicing tape beneath the die to be picked. The exposure cures the UV release dicing tape such that when the machine picks the die from the tape, there is little adhesive force and the die is lifted with minimal chance of damage.

However, for the purposes of plasma dicing, the use of a UV release tape may pose a problem since the dicing plasma is a natural source of ultra-violet light capable of curing the UV release adhesive. The dies, particularly the dies at the periphery of the substrate, can thus be made free to move inside the plasma etch chamber, leading to catastrophic failure of the dicing process including total loss of all devices and fouling of the plasma chamber. Advantages of one or more embodiments described herein may be to provide a solution for the above described problem, where use of a conventional UV release tape may actually have significant drawbacks.

In a most general context, embodiments described herein are particularly suitable for singulation approaches involving at least one plasma etching process for the singulation. In one such embodiment, the singulation is dominated by, if not entirely achieved by, a plasma etching process. In another embodiment, however, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment, the wafer or substrate is supported by a substrate carrier and protected by a proximity contact cover ring at least during the etch portion of the singulation process.

Figure 2:
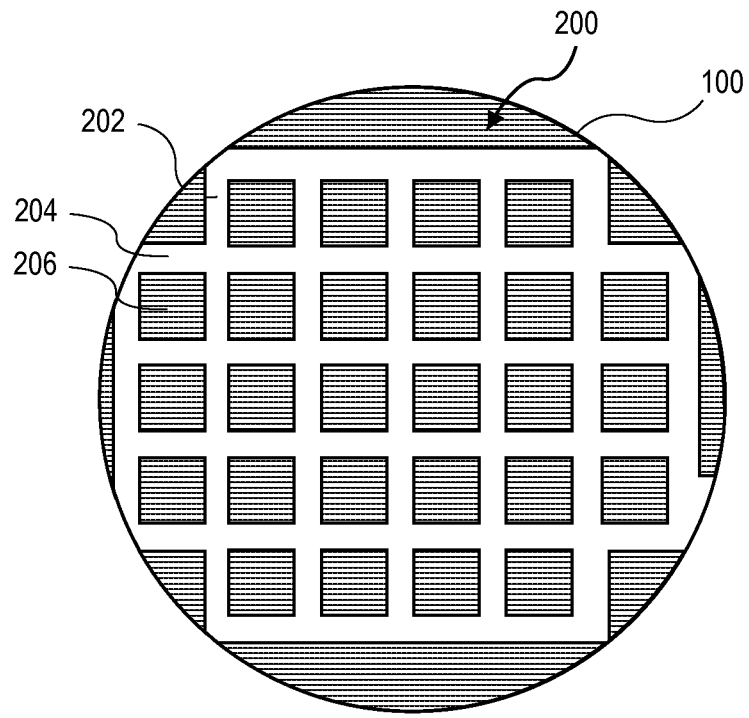
FIG. 2 illustrates a top plan of a semiconductor wafer to be diced that has a dicing mask formed thereon, in accordance with an embodiment of the present invention.

Thus, in accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment. For illustrative purposes, FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are, in one embodiment, patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. In accordance with an embodiment of the present invention, the semiconductor wafer 100 is supported by a wafer carrier during one or both of the laser scribing and/or plasma etching processes.

Figure 3A:
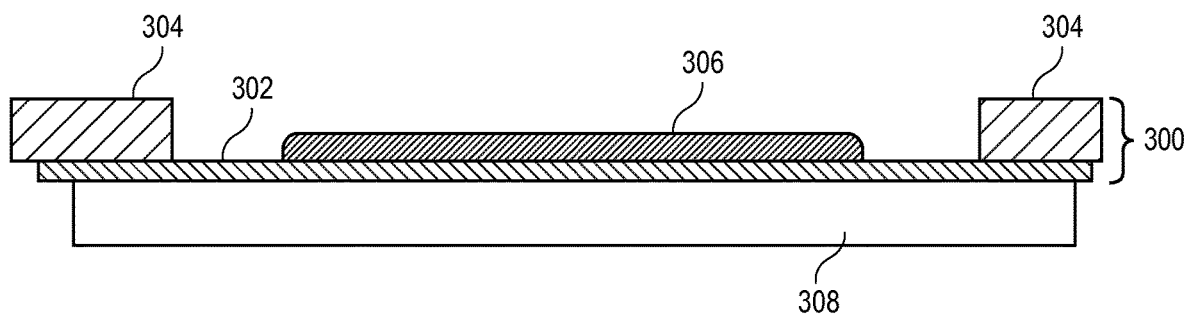
FIGS. 3A and 3B illustrate a cross-sectional view and corresponding plan view, respectively, of a semiconductor substrate supported by a conventional substrate carrier.
Figure 3B:
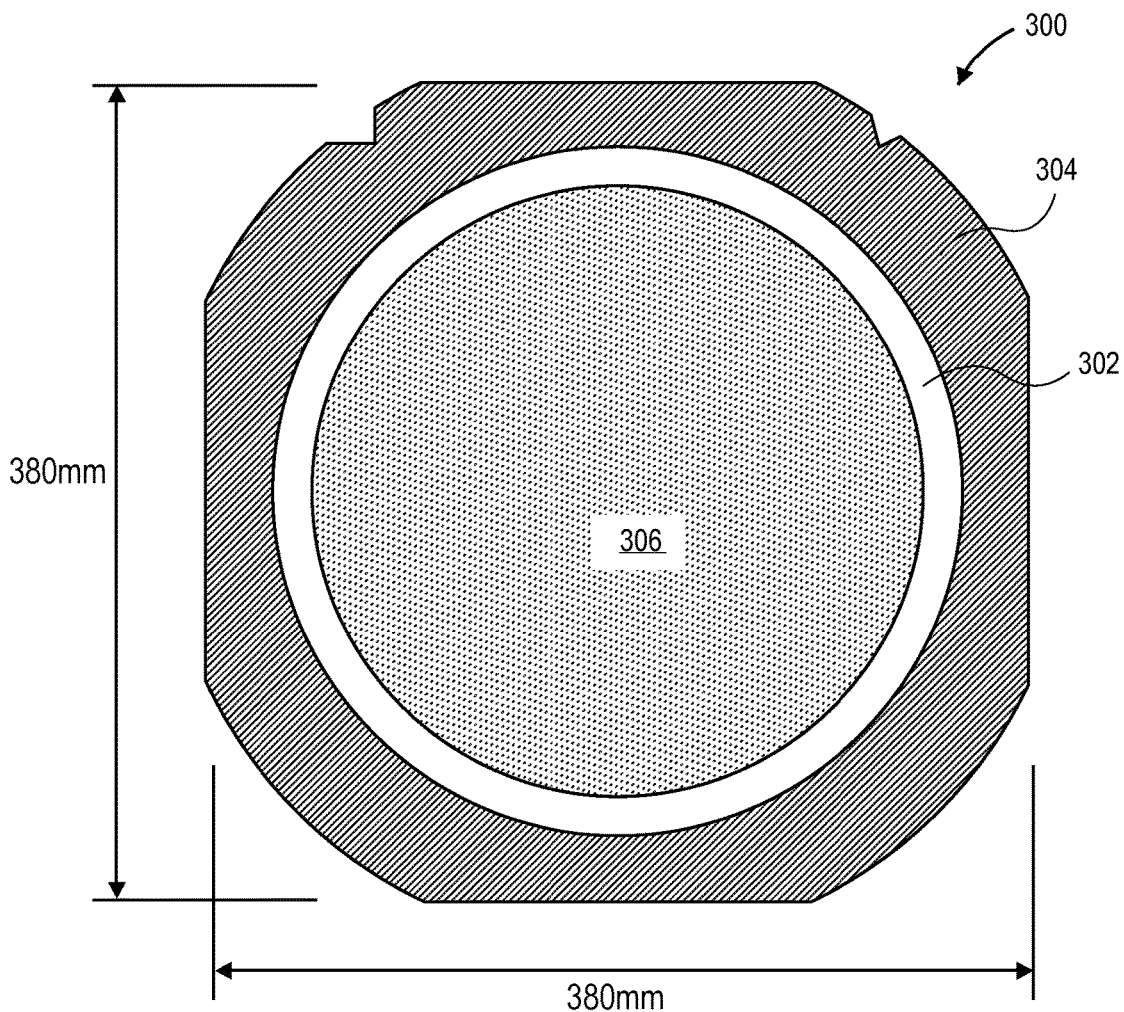

As mentioned above, a semiconductor substrate may be affixed to a dicing frame by way of a UV release dicing tape. FIGS. 3A and 3B illustrate a cross-sectional view and corresponding plan view, respectively, of a semiconductor substrate supported by a conventional substrate carrier.

Referring to FIGS. 3A and 3B, a substrate carrier 300 includes a layer of backing or dicing tape 302 surrounded by a tape ring or frame 304. A wafer or substrate 306 is supported by the dicing tape 302 of the substrate carrier 300. The assembly of the substrate carrier 300 may be processed by supporting the substrate carrier 300 (including the wafer or substrate 306) by a substrate support 308, as is depicted in FIG. 3A.

Referring again to FIGS. 3A and 3B, the top side (wafer or substrate side) of the dicing tape 302 is tacky due to the presence of the UV cure adhesive. The UV cure adhesive holds the wafer or substrate 306 in place lightly, allowing the wafer or substrate 306 to be transported and diced.

With reference again to FIGS. 3A and 3B, if the tape frame (dicing ring), tape, and substrate were to be exposed to a dicing plasma, ultraviolet (UV) radiation from the dicing plasma may likely cause the adhesive on the tape to cure and release. As a consequence, the substrate edges may then begin to release which can result in one or more of several phenomena depending on the substrate thickness, the tensile or compressive stress in the substrate, and the depth to which the wafer had been diced by the time the release takes place. For example, under the conditions of a net tensile stress in the top films of the substrate (e.g., upper device and passivation layers), the peripheral edges of the substrate can lift up from the tape. UV light could be expected to continue to expose the adhesive below the newly lifted substrate until a large portion of the substrate periphery is detached from the dicing tape. Additionally, once singulation has completed, individual die will be released and may even move around in the chamber, which can lead to catastrophic failure.

In accordance with an embodiment of the present invention, a protective cover ring is introduced into a plasma processing chamber as part of the plasma dicing chamber. As an example, FIG. 4A illustrates a cross-sectional view of a proximity contact cover ring positioned above a substrate carrier, in accordance with an embodiment of the present invention.

Figure 4A:
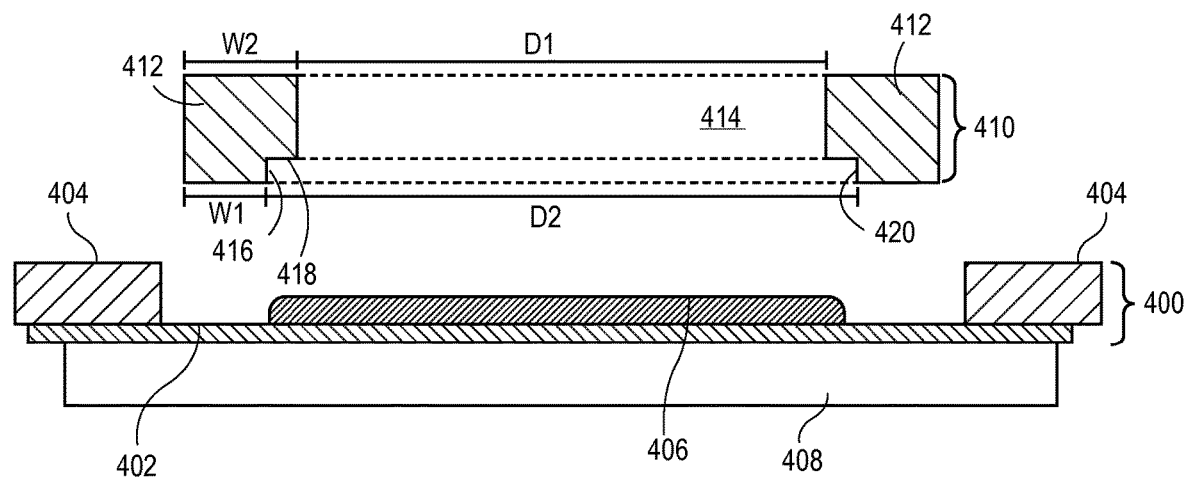
FIG. 4A illustrates a cross-sectional view of a proximity contact cover ring positioned above a substrate carrier, in accordance with an embodiment of the present invention.

Referring to FIG. 4A, a substrate carrier 400, such as the carrier described in association with FIGS. 3A and 3B, is used to support a wafer or substrate 406. The substrate carrier 400 includes a layer of backing or dicing tape 402 surrounded by a tape ring or frame 404. The wafer or substrate 406 is supported by the dicing tape 402 of the substrate carrier 400. The assembly of the substrate carrier 400 may be processed by supporting the substrate carrier 400 (including the wafer or substrate 406) by a substrate support 408, as is depicted in FIG. 4A.

Referring again to FIG. 4A, as was the case in FIG. 3A, in an embodiment, the top side (wafer or substrate side) of the dicing tape 402 is tacky due to the presence of the UV cure adhesive. The UV cure adhesive holds the wafer or substrate 406 in place lightly, allowing the wafer or substrate 406 to be transported and diced. It is to be appreciated that in other embodiment, a dicing tape that is not UV curable is used in place of a UV curable dicing tape.

The substrate support 408 may be a chuck such as a helium cooled electrostatic chuck or a passive mechanical chuck. Thus, the substrate, carrier and support assembly of FIG. 4A includes, in one embodiment, a sample substrate 406 is affixed to a dicing frame 404 by a UV release dicing tape 402 and is held on a support 408. In a particular embodiment, the wafer or substrate 406 is attached directly to the dicing tape 402. However, in another particular embodiment, the wafer or substrate 406 is attached to the dicing tape 402 by an intervening die attach film.

Referring again to FIG. 4A, a proximity contact cover ring 410 is positioned above the wafer or substrate 406 and carrier 400 assembly. As seen from the cross-sectional view, the proximity contact cover ring 410 includes an outer frame 412 and inner opening 414. In one such embodiment the outer frame 412 is an annular frame and the inner opening 414 is a circular opening. In a particular embodiment, from a cross-sectional perspective, the frame has an upper width (W1) and a lower recessed width (W2), as recessed in from the inner opening 414. The resulting shape of the proximity contact cover ring 410 may be described as including a bevel 416 with an overhanging surface 418 and a peripheral surface 420. Thus, in a particular embodiment, the inner opening 414 has an upper diameter (D1) smaller than a lower diameter (D2), as is depicted in FIG. 4A. In an embodiment, the outer frame 412 is composed of stainless steel or a thermally resistant material.

In preparation for plasma processing, a proximity contact cover ring may be lowered onto a dicing frame assembly supported by the substrate support. For example, FIG. 4B illustrates a cross-sectional view of the proximity contact cover ring of FIG. 4A as lowered onto the substrate carrier of FIG. 4A, in accordance with an embodiment of the present invention.

Figure 4B:
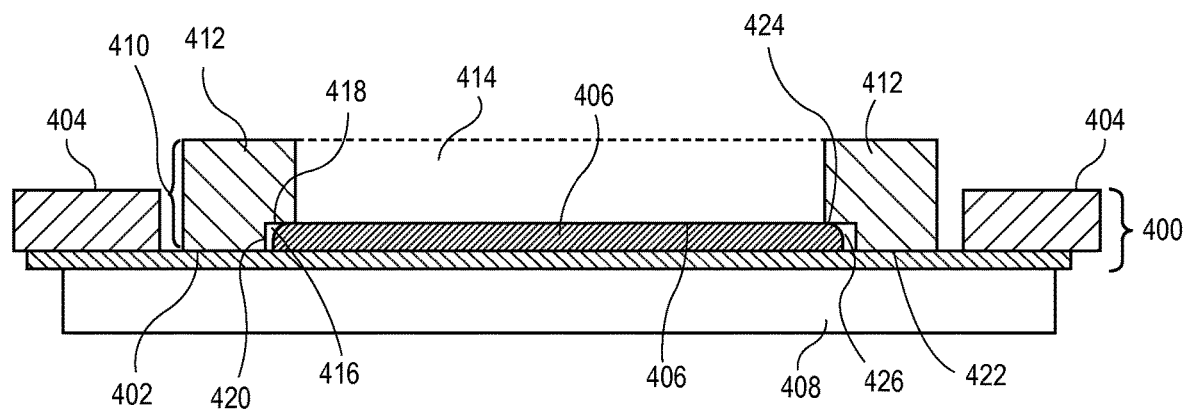
FIG. 4B illustrates a cross-sectional view of the proximity contact cover ring of FIG. 4A as lowered onto the substrate carrier of FIG. 4A, in accordance with an embodiment of the present invention.

Referring to FIG. 4B, the proximity contact cover ring 410 is lowered onto the assembly of the carrier 400 and the wafer or substrate 406. As depicted, in an embodiment, the proximity cover ring 410 is lowered to ultimately provide the outer frame 412 in contact with the dicing tape 402 (tape-to-frame contact 422). As is also depicted, in an embodiment, the lowering of the proximity cover ring 410 provides the overhanging surface 418 of the bevel 416 in contact with the upper surface of the wafer or substrate 406 (substrate-to frame contact 424). Although not depicted, in an embodiment, the lowering of the proximity cover ring 410 provides the peripheral surface 420 of the bevel 416 in contact with the peripheral surface of the wafer or substrate 406 (i.e., at location 426, which itself may be described as a beveled edge of the wafer or substrate 406). Furthermore, although not depicted, in an embodiment, the lowering of the proximity cover ring 410 provides the tape ring or frame 404 in contact with and/or covered by the proximity cover ring 410.

It is to be appreciated that, in an embodiment, the proximity cover ring 410 may be in actual contact with only one of the dicing tape 402 (i.e., at tape-to-frame contact 422), the upper surface of the wafer or substrate 406 (i.e., at substrate-to frame contact 424), the peripheral surface of the wafer or substrate 406 (i.e., at location 426), or the tape ring or frame 404. In other embodiments, however, the proximity cover ring 410 is in actual contact with two or more of, and possibly all of, the dicing tape 402 (i.e., at tape-to-frame contact 422), the upper surface of the wafer or substrate 406 (i.e., at substrate-to frame contact 424), the peripheral surface of the wafer or substrate 406 (i.e., at location 426), or the tape ring or frame 404. In locations where actual contact is not made, the proximity cover ring 410 is said to be proximate to those locations.

Perhaps more generally, the proximity cover ring 410, once lowered, may be described as being in close proximity and possible contact with (1) the substrate front surface, (2) the substrate's bevel area at the periphery, (3) the release dicing tape (which may be a UV release dicing tape), or (4) the frame of the substrate carrier. In an embodiment, the proximity contact cover ring 410 is lowered onto the substrate carrier 400 and wafer or substrate 406 assembly prior to plasma processing in order to protect the adhesive of the tape 402 from ultra-violet radiation generated by the plasma during plasma processing. Furthermore, in an embodiment, when contact is made to the substrate or substrate bevel, the proximity contact cover ring 410 can act to maintain a positive contact between the dicing tape and the substrate around the edge of the substrate. It is to be appreciated that reference to "lowered" or "lowering" when describing bring the proximity contact cover ring 410 together with the carrier assembly is relative and can actually mean raising the carrier 400/substrate 406 assembly toward the proximity contact cover ring 410 or both raising the carrier 400/substrate 406 assembly toward the proximity contact cover ring 410 and lowering the proximity contact cover ring 410 toward the carrier 400/substrate 406 assembly.

Figure 4C:
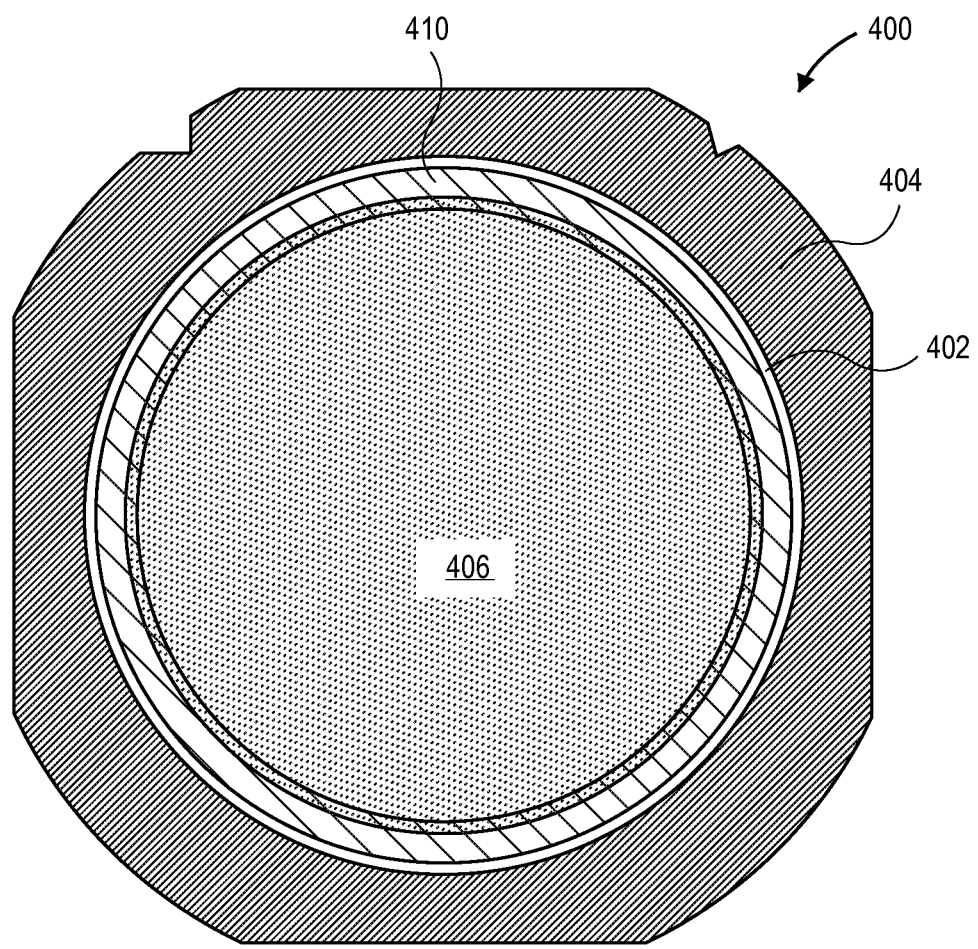
FIG. 4C illustrates a plan view of the assembly of FIG. 4B, in accordance with an embodiment of the present invention.

FIG. 4C illustrates a plan view of the assembly of FIG. 4B, in accordance with an embodiment of the present invention. Referring to FIG. 4C, from top down perspective, a portion of the wafer or substrate 406 is covered by the proximity contact cover ring 410. In one such embodiment, an outermost 0.5-1.5 millimeters of the wafer or substrate 406 is covered around the circumference of the wafer or substrate 406. The portion covered may be referred to as the exclusion region of the wafer or substrate 406 since this area is not used as a die region.

Consistent with the illustration of FIG. 4B, in FIG. 4C, a portion of the dicing tape 402 is exposed from the top down perspective. However, in other embodiments, the proximity contact cover ring 410 covers all of the dicing tape 402. In yet other embodiments, in order to protect the carrier tape and/or frame, during plasma processing an additional shadow ring is used in conjunction with the proximity contact cover ring 410.

Thus, in an embodiment, a cover ring 410 for protecting a carrier 400 and substrate 406 assembly during an etch process includes an inner opening 414 having a diameter (D1) smaller than the diameter of a substrate 406 of the carrier 400 and substrate 406 assembly. An outer frame 412 surrounds the inner opening 414. The outer frame 412 has a bevel 416 for accommodating an outermost portion of the substrate 406 of the carrier 400 and substrate 406 assembly.

Referring again to the cross-sectional view of the outer frame 412 of the proximity contact cover ring 410, the profile depicted for the lower bevel regions is not so limited. For example, FIG. 5 illustrates cross-sectional views of exemplary options for proximity contact cover ring geometry, in accordance with an embodiment of the present invention.

Figure 5:
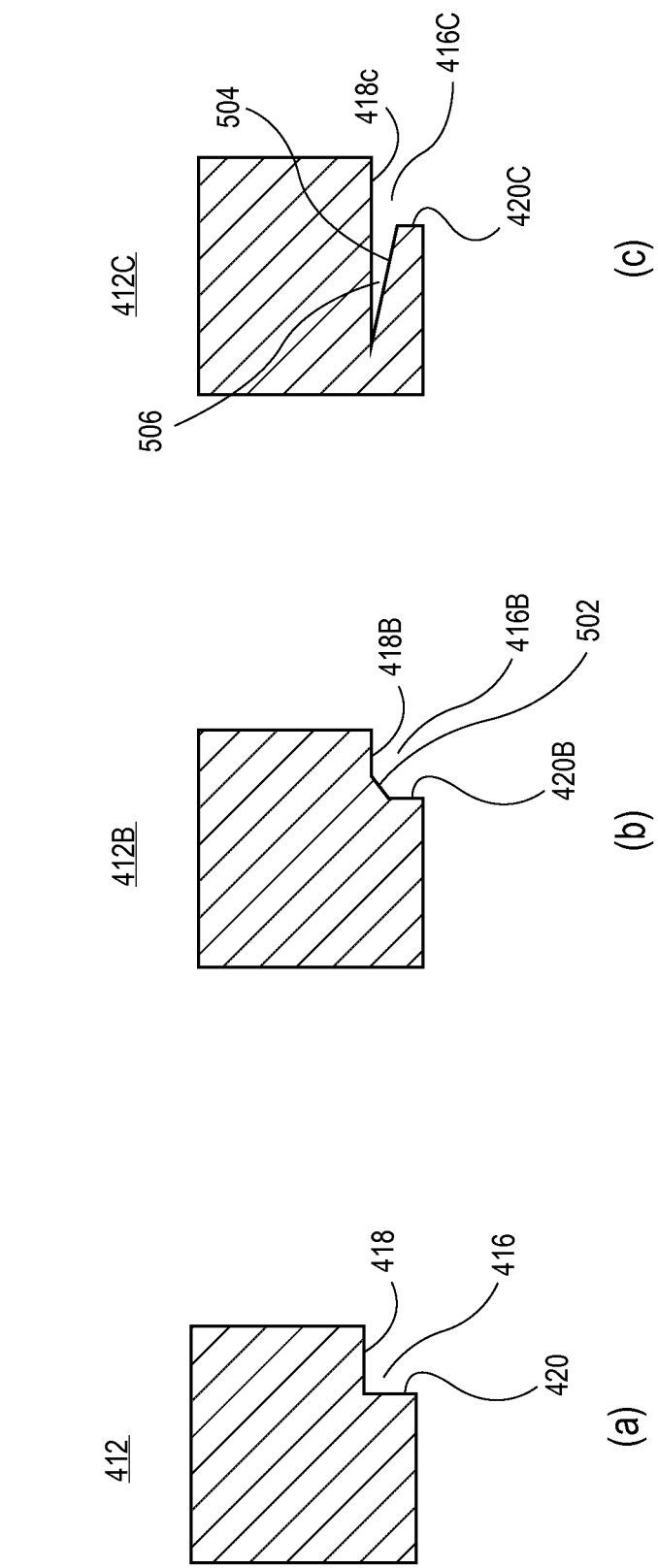
FIG. 5 illustrates cross-sectional views of exemplary options for proximity contact cover ring geometry, in accordance with an embodiment of the present invention.

Referring to part (a) of FIG. 5, for reference, the outer frame 412 profile of FIGS. 4A and 4B is depicted. As shown in FIG. 5, the outer frame 412 profile 412 includes the bevel 416 having the overhanging surface 418 (horizontal) and a peripheral surface 420 (vertical). In one embodiment, the profile (a) is a simple profile that allows for contact to the substrate top surface, the tape, or both.

In another embodiment, referring to part (b) of FIG. 5, an outer frame profile 412b includes a bevel 416b. The bevel 416b has a horizontal overhanging surface 418b and a vertical peripheral surface 420b joined by a protruding sloped surface 502. In one embodiment, the profile (b) allows for contact to any or all of the substrate top surface, the tape, and the substrate bevel area.

In yet another embodiment, referring to part (c) of FIG. 5, an outer frame profile 412c includes a bevel 416c. The bevel 416c has a horizontal overhanging surface 418c and a vertical peripheral surface 420c joined by a recessed sloped surface 504. It is to be appreciated that other geometries may be suitable from the outer frame profile of a proximity contact cover ring. In one embodiment, the profile (c) allows for contact to the substrate top surface, the tape surface, or both and has the additional enhancement of a light trap region 506. In the light trap region 506, light seeping under the cover ring can be trapped and extinguished through multiple reflections within the light trap region 506.

In any case, in an embodiment, the outer frame of a proximity contact cover ring is composed of stainless steel. In another embodiment, however, the outer frame of a proximity contact cover ring is composed of a thermally resistant plastic. In a particular example, of the latter embodiment, the outer frame may be composed of polyphenylene sulfide (PPS). In an embodiment, a proximity contact cover ring is composed of a material that is substantially, if not entirely, non-transmissive to UV radiation. That is, the proximity contact cover ring may block substantially all UV radiation impinged thereon.

As mentioned above, a proximity contact cover ring may be sized to extend over a portion or all of the substrate carrier frame, providing further protection for the substrate carrier frame and tape during plasma processing. As an example, FIG. 6A illustrates a cross-sectional view of another proximity contact cover ring as lowered onto a substrate carrier, and FIG. 6B illustrates a plan view of the assembly of FIG. 6A, in accordance with another embodiment of the present invention.

Figure 6A:
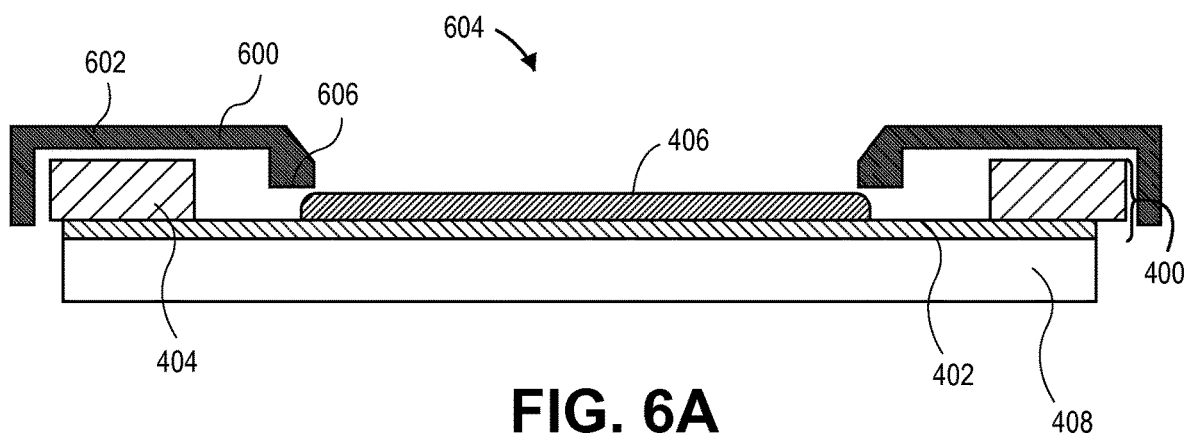
FIG. 6A illustrates a cross-sectional view of another proximity contact cover ring as lowered onto a substrate carrier.
Figure 6B:
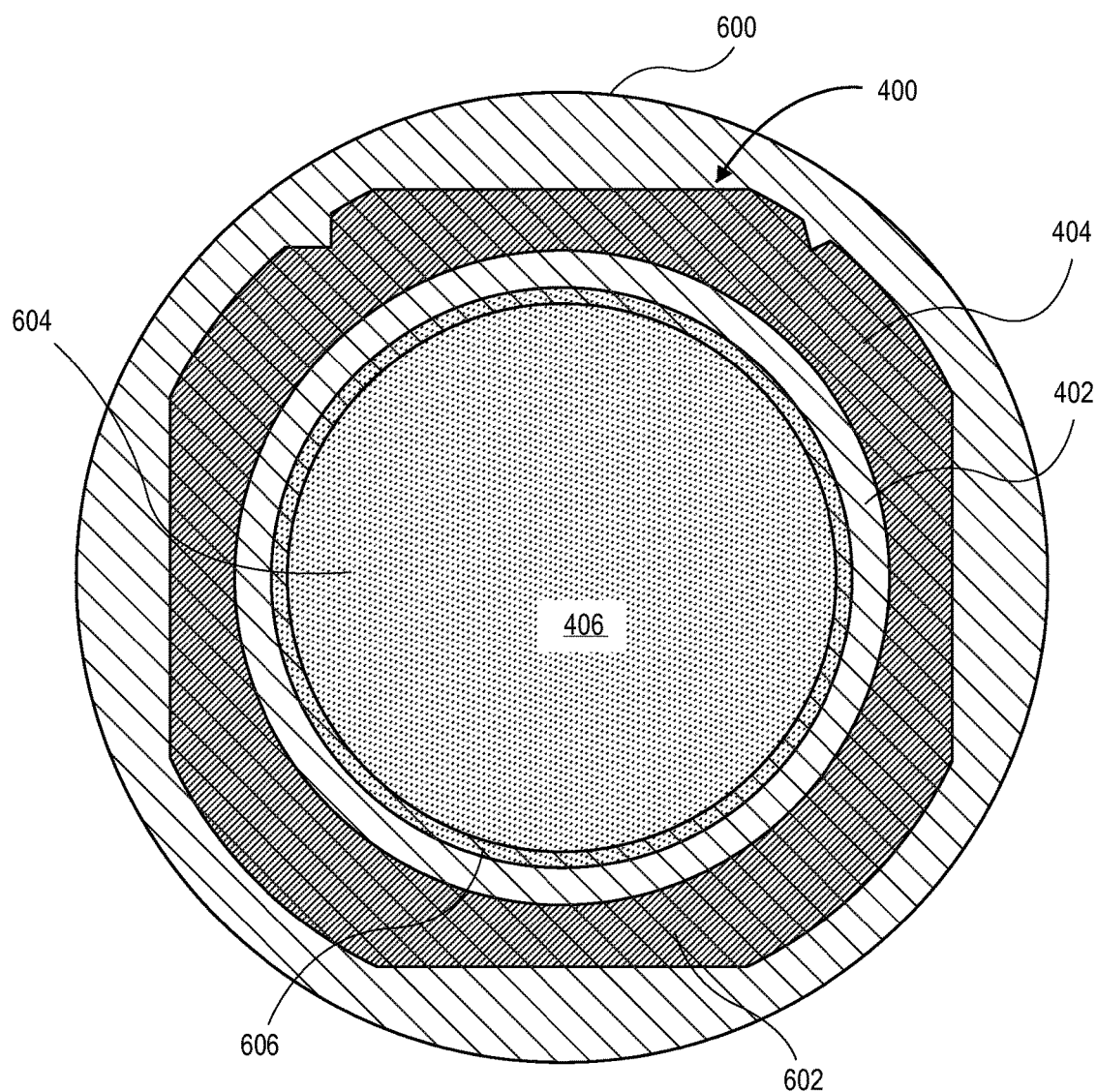
FIG. 6B illustrates a plan view of the assembly of FIG. 6A, in accordance with another embodiment of the present invention.

Referring to FIGS. 6A and 6B, the substrate carrier 400/substrate 406 assembly described in association with FIGS. 4A-4C is depicted as having a proximity contact cover ring 600 lowered there over. The proximity contact cover ring 600 has a portion 606 covering the outermost region of the wafer or substrate 406, with an opening 604 therein exposing the remaining portions of the wafer or substrate 406. Another portion 602 of the proximity contact cover ring 600 covers the tape frame 404 of the substrate carrier 400. Although only shown generically, in an embodiment, the portion 606 may include a feature with a bevel, as was described in association with FIG. 5.

Referring again to FIGS. 6A and 6B, in use, the proximity contact cover ring 600 is brought to close proximity or contact with the wafer or substrate 406 in the edge exclusion zone. The proximity contact cover ring 600 is also shown as providing protection for the dicing tape 402 otherwise exposed between the wafer or substrate 406 and the dicing tape frame 404. In an embodiment, the arrangement allows for protecting the tape from UV exposure while at the same time providing an additional thermal protection to the dicing tape 402 and frame 404 of the substrate carrier 400.

In accordance with one or more embodiments of the present invention, the extent of proximity or actual contact of a proximity contact cover ring in relation to a substrate carrier assembly during plasma processing, is controlled by a drive mechanism utilizing precision position control. For example, in one embodiment, a servo motor with encoder and linear guide is employed to provide such control. In an embodiment, the distance between the wafer and the proximity contact cover ring is factored as part of the plasma process and is controlled anywhere from zero spacing (contact) to hundreds of microns spacing.

Figure 11:
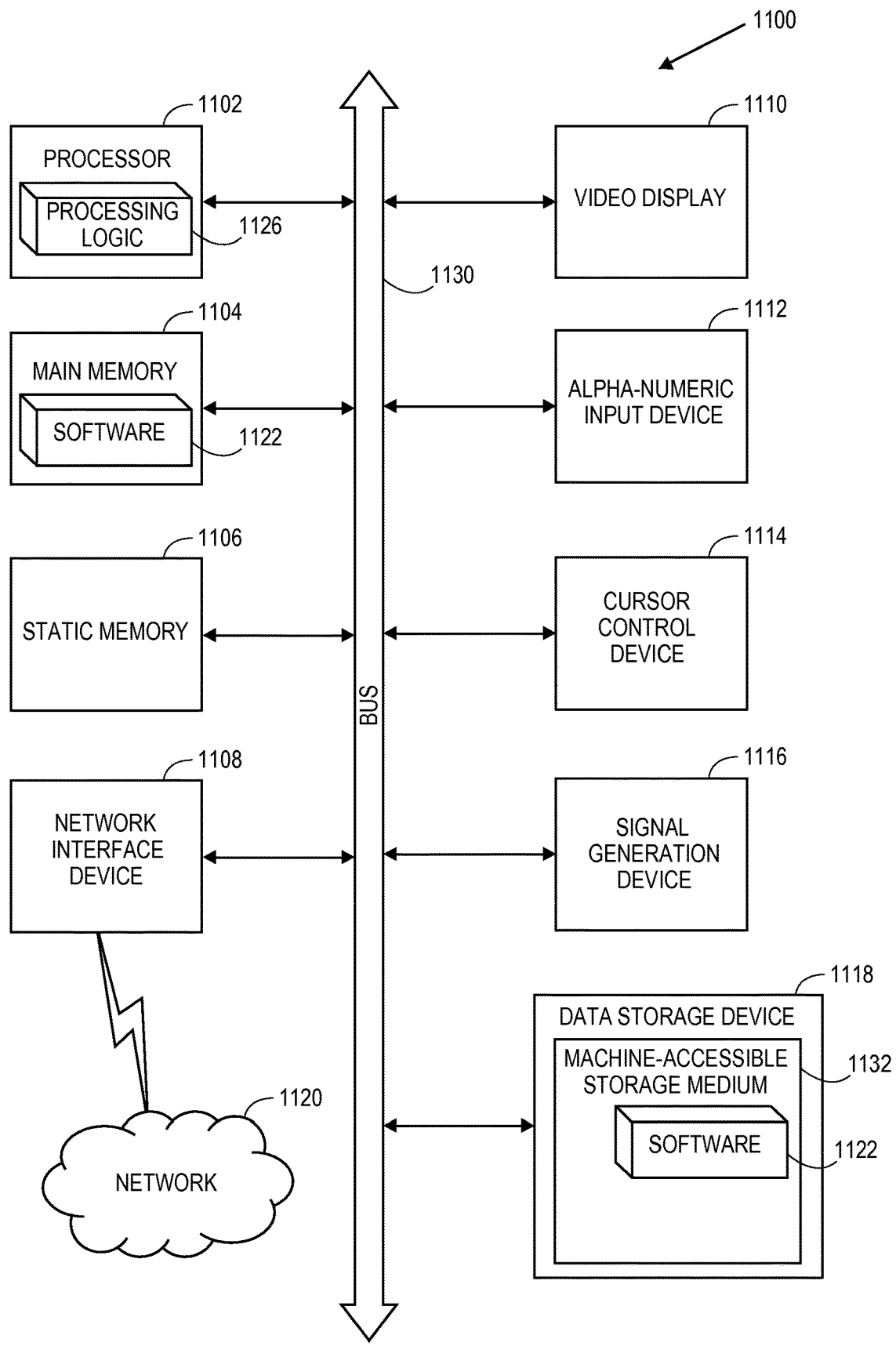
FIG. 11 illustrates a block diagram of an exemplary computer system, in accordance with an embodiment of the present invention.

In an aspect of the present embodiments, an etch reactor is configured to accommodate etching of a wafer or substrate supported by a substrate carrier and protected by a proximity contact cover ring. For example, FIG. 11 illustrates a cross-sectional view of an etch reactor, in accordance with an embodiment of the present invention.

Figure 7:
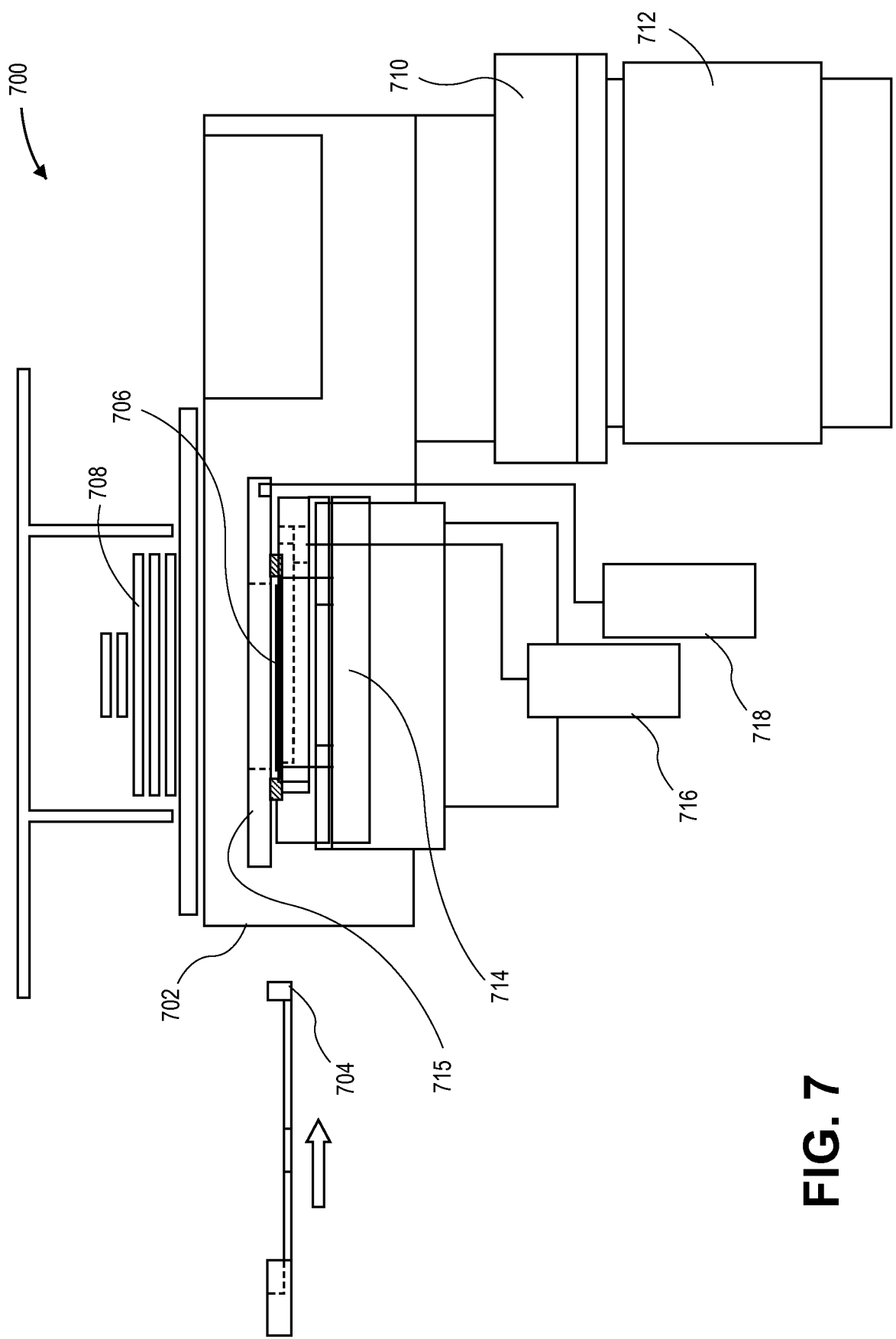
FIG. 7 illustrates a cross-sectional view of an etch reactor, in accordance with an embodiment of the present invention.

Referring to FIG. 7, an etch reactor 700 includes a chamber 702. An end effector 704 is included for transferring a substrate carrier 706 to and from chamber 702. An inductively coupled plasma (ICP) source 708 is positioned in an upper portion of the chamber 702. The chamber 702 is further equipped with a throttle valve 710 and a turbo molecular pump 712. The etch reactor 700 also includes a cathode assembly 714.

A proximity contact cover ring assembly 715 is included above the region accommodating the substrate or wafer carrier 706. In an embodiment, the proximity contact cover ring assembly 715 includes a tape frame lift. In an embodiment, the proximity contact cover ring assembly 715 is or includes a proximity contact cover ring as described in association with FIGS. 4A-4C, 5, 6A and 6B. A proximity contact cover ring actuator 718 may be included for moving the proximity contact cover ring. In one such embodiment, the proximity contact cover ring actuator 718 moves a single lift hoop that is coupled to a tape frame lift and a proximity contact cover ring. Other actuators, such as an actuator 716 for moving a substrate carrier lift mechanism may also be included. In yet other embodiments, in order to protect the carrier tape and/or frame, during plasma processing an additional shadow ring is used in conjunction with the proximity contact cover ring assembly 715.

In an embodiment, the end effector 704 is a robot blade sized for handling a substrate carrier. In one such embodiment, the robotic end effector 704 supports a film frame assembly (e.g., substrate carrier 400, described above) during transfer to and from an etch reactor under sub-atmospheric pressure (vacuum). The end effector 704 includes features to support the substrate carrier in the X-Y-Z axis with gravity-assist. The end effector 704 also includes a feature to calibrate and center the end effector with respect to circular features of a processing tool (e.g., a bipolar electrostatic chuck center, or a center of a circular silicon wafer).

Figure 8:
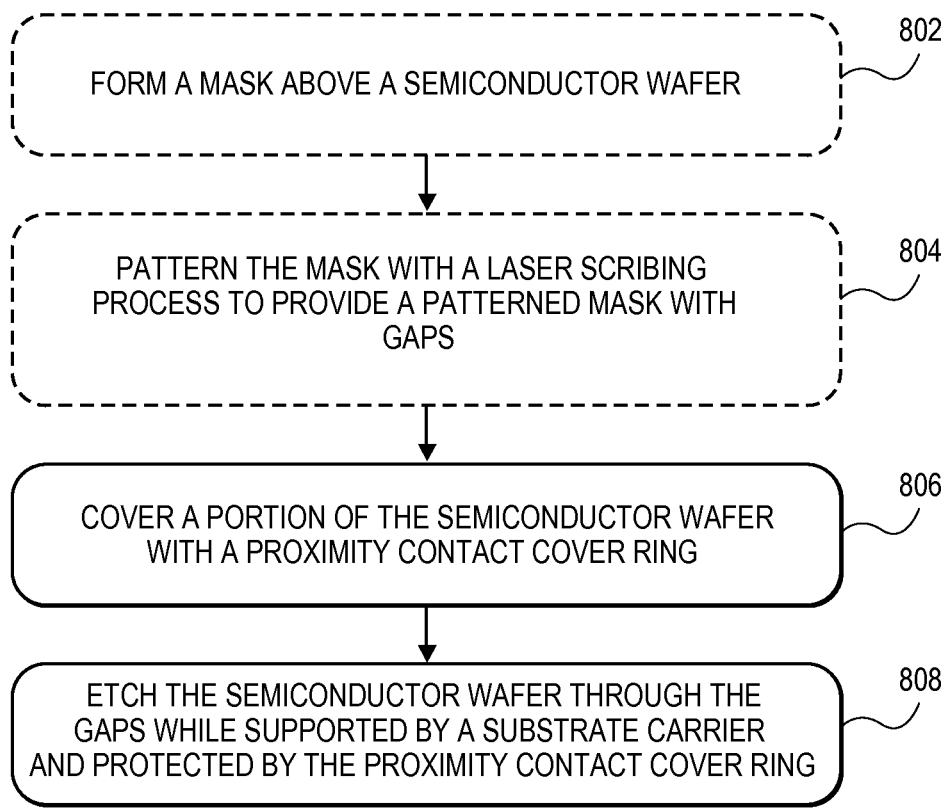
FIG. 8 is a Flowchart representing operations in a method of dicing a semiconductor wafer including a plurality of integrated circuits, in accordance with an embodiment of the present invention.
Figure 9A:
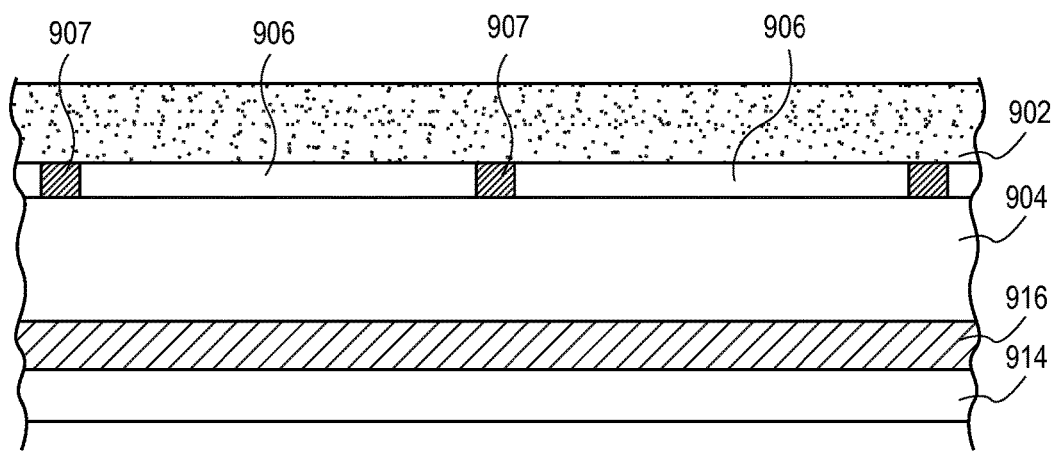
FIG. 9A illustrates a cross-sectional view of a semiconductor wafer including a plurality of integrated circuits during performing of a method of dicing the semiconductor wafer, corresponding to operation 802 of the Flowchart of FIG. 8, in accordance with an embodiment of the present invention.
Figure 9B:
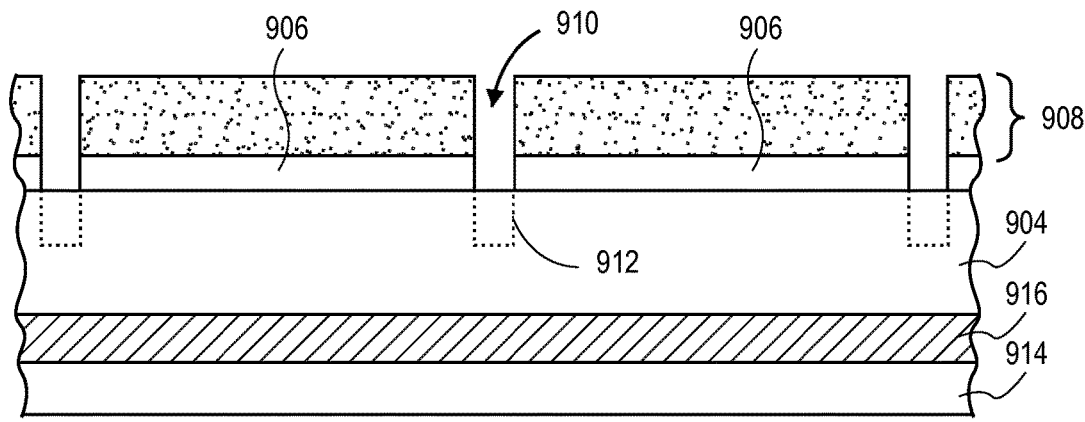
FIG. 9B illustrates a cross-sectional view of a semiconductor wafer including a plurality of integrated circuits during performing of a method of dicing the semiconductor wafer, corresponding to operation 804 of the Flowchart of FIG. 8, in accordance with an embodiment of the present invention.
Figure 9C:
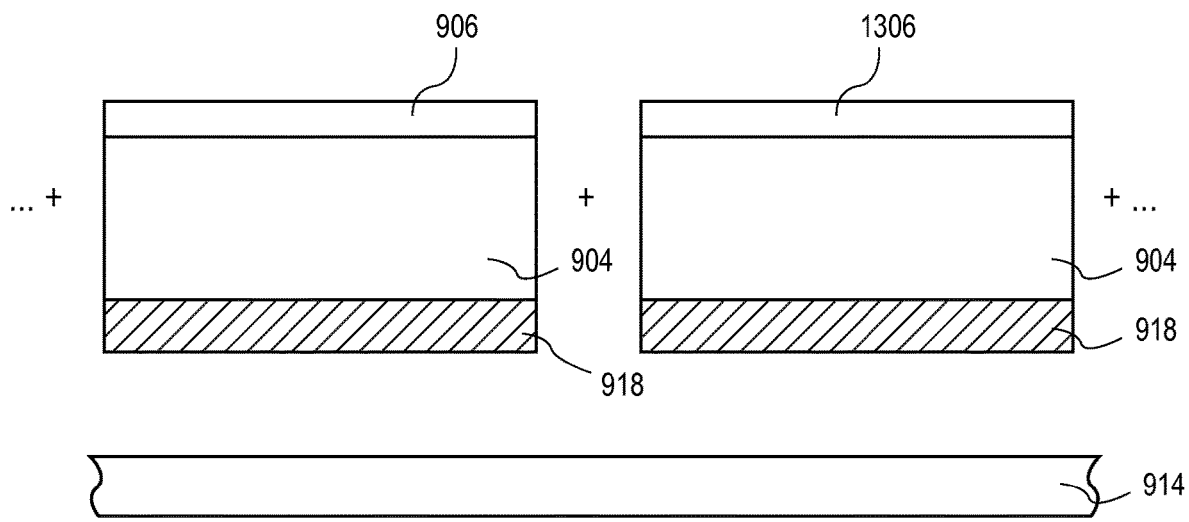
FIG. 9C illustrates a cross-sectional view of a semiconductor wafer including a plurality of integrated circuits during performing of a method of dicing the semiconductor wafer, corresponding to operations 806 and 808 of the Flowchart of FIG. 8, in accordance with an embodiment of the present invention.

In another aspect, FIG. 8 is a Flowchart 800 representing operations in a method of dicing a semiconductor wafer including a plurality of integrated circuits, in accordance with an embodiment of the present invention. FIGS. 9A-9C illustrate cross-sectional views of a semiconductor wafer including a plurality of integrated circuits during performing of a method of dicing the semiconductor wafer, corresponding to operations of Flowchart 800, in accordance with an embodiment of the present invention.

Referring to optional operation 802 of Flowchart 800, and corresponding FIG. 9A, a mask 902 is formed above a semiconductor wafer or substrate 904. The mask 902 is composed of a layer covering and protecting integrated circuits 906 formed on the surface of semiconductor wafer 904. The mask 902 also covers intervening streets 907 formed between each of the integrated circuits 906. The semiconductor wafer or substrate 904 is supported by a substrate carrier 914 (only a tape portion of which is depicted), such as the substrate carrier 400 described above. In an embodiment, the substrate carrier 914 includes a layer of backing tape, a portion of which is depicted as 914 in FIG. 9A, surrounded by a tape ring or frame (not shown). In one such embodiment, the semiconductor wafer or substrate 904 is disposed on a die attach film 916 disposed on the substrate carrier 914, as is depicted in FIG. 9A.

In accordance with an embodiment of the present invention, forming the mask 902 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 902 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 902 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 904 is composed of a material suitable to withstand a fabrication process and upon which semiconductor processing layers may suitably be disposed. For example, in one embodiment, semiconductor wafer or substrate 904 is composed of a group IV-based material such as, but not limited to, crystalline silicon, germanium or silicon/germanium. In a specific embodiment, providing semiconductor wafer 904 includes providing a monocrystalline silicon substrate. In a particular embodiment, the monocrystalline silicon substrate is doped with impurity atoms. In another embodiment, semiconductor wafer or substrate 904 is composed of a material such as, e.g., a material substrate used in the fabrication of light emitting diodes (LEDs).

In an embodiment, the semiconductor wafer or substrate 904 has a thickness of approximately 300 microns or less. For example, in one embodiment, a bulk single-crystalline silicon substrate is thinned from the backside prior to being affixed to the die attach film 916. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 916 (or any suitable substitute capable of bonding a thinned or thin wafer or substrate to the substrate carrier 914) has a thickness of approximately 20 microns.

In an embodiment, the semiconductor wafer or substrate 904 has disposed thereon or therein, as a portion of the integrated circuits 906, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 906. Materials making up the streets 907 may be similar to or the same as those materials used to form the integrated circuits 906. For example, streets 907 may be composed of layers of dielectric materials, semiconductor materials, and metallization. In one embodiment, one or more of the streets 907 includes test devices similar to the actual devices of the integrated circuits 906.

Referring to optional operation 804 of Flowchart 800, and corresponding FIG. 9B, the mask 902 is patterned with a laser scribing process to provide a patterned mask 908 with gaps 910, exposing regions of the semiconductor wafer or substrate 904 between the integrated circuits 906. In one such embodiment, the laser scribing process is a femtosecond-based laser scribing process. The laser scribing process is used to remove the material of the streets 907 originally formed between the integrated circuits 906. In accordance with an embodiment of the present invention, patterning the mask 902 with the laser scribing process includes forming trenches 912 partially into the regions of the semiconductor wafer 904 between the integrated circuits 906, as is depicted in FIG. 9B.

In an embodiment, patterning the mask 902 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 902, the streets 907 and, possibly, a portion of the semiconductor wafer or substrate 904. By using a laser with a pulse width in the femtosecond range, heat damage issues may be mitigated or eliminated. The elimination or mitigation of damage may be due to a lack of low energy recoupling (as is seen for picosecond-based laser ablation) or thermal equilibrium (as is seen for nanosecond-based laser ablation).

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption.

However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 806 of Flowchart 800, a portion of the semiconductor wafer or substrate 904 is covered with a proximity contact cover ring, e.g., to protect a tape and tape frame of the substrate carrier 914 and/or to secure the semiconductor wafer or substrate 904 during plasma etching. In one embodiment, the proximity contact cover ring leaves exposed a portion of, but not all of, the semiconductor wafer or substrate 904, as described above in association with FIGS. 4C and 6B. In an embodiment, the proximity contact cover ring is the same as or similar to one or more of the proximity contact cover rings described in association with FIGS. 4A-4C, 5, 6A and 6B. In yet other embodiments, in order to protect the carrier tape and/or frame, during plasma processing an additional shadow ring is used in conjunction with the proximity contact cover ring.

Referring to operation 808 of Flowchart 800, and corresponding FIG. 9C, the semiconductor wafer or substrate 904 is then etched through the gaps 910 in the patterned mask 908 to singulate the integrated circuits 906. In accordance with an embodiment of the present invention, etching the semiconductor wafer 904 includes etching to extend the trenches 912 formed with the laser scribing process and to ultimately etch entirely through semiconductor wafer or substrate 904, as depicted in FIG. 9C.

In an embodiment, etching the semiconductor wafer or substrate 904 includes using a plasma etching process. In one embodiment, a through-silicon via type etch process is used. For example, in a specific embodiment, the etch rate of the material of semiconductor wafer or substrate 904 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 1304 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 916. In one embodiment, die attach film 916 is patterned by a technique such as, but not limited to, laser ablation, dry (plasma) etching or wet etching. In an embodiment, the die attach film 916 is patterned in sequence following the laser scribe and plasma etch portions of the singulation process to provide die attach film portions 918, as depicted in FIG. 9C. In an embodiment, the patterned mask 908 is removed after the laser scribe and plasma etch portions of the singulation process, as is also depicted in FIG. 9C. The patterned mask 908 may be removed prior to, during, or following patterning of the die attach film 916. In an embodiment, the semiconductor wafer or substrate 904 is etched while supported by the substrate carrier 914 and while protected by a proximity contact cover ring. In an embodiment, the die attach film 916 is also patterned while disposed on the substrate carrier 914, and while the semiconductor wafer or substrate 904 is protected by the proximity contact cover ring.

Accordingly, referring again to Flowchart 800 and FIGS. 9A-9C, wafer dicing may be performed by initial laser ablation through a mask, through wafer streets (including metallization), and partially into a silicon substrate. The laser pulse width may be selected in the femtosecond range. Die singulation may then be completed by subsequent through-silicon deep plasma etching. In one embodiment, a proximity contact cover ring is implemented during the etch portion of the dicing process. Additionally, removal of exposed portions of the die attach film may be performed to provide singulated integrated circuits, each having a portion of a die attach film thereon. The individual integrated circuits, including die attach film portions may then be removed from the substrate carrier 914, as depicted in FIG. 9C. In an embodiment, the singulated integrated circuits are removed from the substrate carrier 914 for packaging. In one such embodiment, the patterned die attach film 918 is retained on the backside of each integrated circuit and included in the final packaging. However, in another embodiment, the patterned die attach film 914 is removed during or subsequent to the singulation process.

A single process tool may be configured to perform many or all of the operations in a hybrid laser ablation and plasma etch singulation process. For example, FIG. 10 illustrates a block diagram of a tool layout for laser and plasma dicing of wafers or substrates, in accordance with an embodiment of the present invention.

Figure 10:
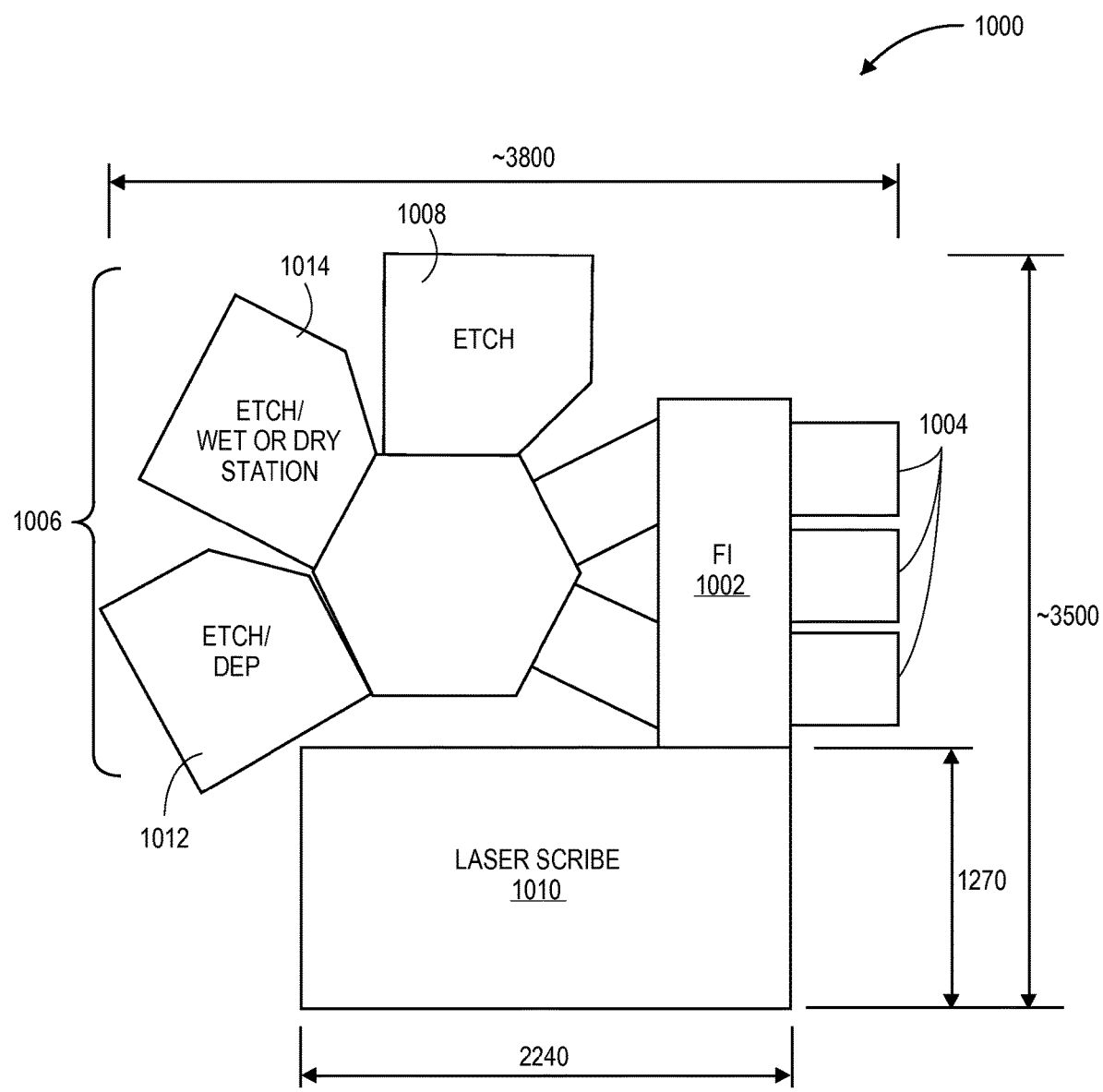
FIG. 10 illustrates a block diagram of a tool layout for laser and plasma dicing of wafers or substrates, in accordance with an embodiment of the present invention.

Referring to FIG. 10, a process tool 1000 includes a factory interface 1002 (FI) having a plurality of load locks 1004 coupled therewith. A cluster tool 1006 is coupled with the factory interface 1002. The cluster tool 1006 includes one or more plasma etch chambers, such as plasma etch chamber 1008. A laser scribe apparatus 1010 is also coupled to the factory interface 1002. The overall footprint of the process tool 1000 may be, in one embodiment, approximately 3500 millimeters (3.5 meters) by approximately 3800 millimeters (3.8 meters), as depicted in FIG. 10.

In an embodiment, the one or more plasma etch chambers 1008 is configured for etching a wafer or substrate through the gaps in a patterned mask to singulate a plurality of integrated circuits. In one such embodiment, the one or more plasma etch chambers 1008 is configured to perform a deep silicon etch process. In a specific embodiment, the one or more plasma etch chambers 1008 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1008 to facilitate high silicon etch rates. In an embodiment, more than one etch chamber is included in the cluster tool 1006 portion of process tool 1000 to enable high manufacturing throughput of the singulation or dicing process. In accordance with an embodiment of the present invention, at least one of the etch chambers 808 is equipped with a proximity contact cover ring, such as a proximity contact cover ring described above in association with FIGS. 4A-4C, 5, 6A and 6B.

In an embodiment, the laser scribe apparatus 1010 houses a femtosecond-based laser. The femtosecond-based laser may be suitable for performing a laser ablation portion of a hybrid laser and etch singulation process, such as the laser ablation processes described above. In one embodiment, a moveable stage is also included in laser scribe apparatus 1000, the moveable stage configured for moving a wafer or substrate (or a carrier thereof) relative to the femtosecond-based laser. In a specific embodiment, the femtosecond-based laser is also moveable. The overall footprint of the laser scribe apparatus 1010 may be, in one embodiment, approximately 2240 millimeters by approximately 1270 millimeters, as depicted in FIG. 10.

The factory interface 1002 may be a suitable atmospheric port to interface between an outside manufacturing facility with laser scribe apparatus 1010 and cluster tool 1006. The factory interface 1002 may include robots with arms or blades for transferring wafers (or carriers thereof) from storage units (such as front opening unified pods) into either cluster tool 1006 or laser scribe apparatus 1010, or both.

Cluster tool 1006 may include other chambers suitable for performing functions in a method of singulation. For example, in one embodiment, in place of an additional etch chamber, a deposition chamber 1012 is included. The deposition chamber 1012 may be configured for mask deposition on or above a device layer of a wafer or substrate prior to laser scribing of the wafer or substrate. In one such embodiment, the deposition chamber 1012 is suitable for depositing a water soluble mask layer. In another embodiment, in place of an additional etch chamber, a wet/dry station 1014 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 1000.

Referring collectively to FIGS. 7 and 10, in an embodiment, a singulation process can be accommodated in a system sized to receive a substrate carrier such as the substrate carrier 400. In one such embodiment, a system such as system 700 or 1000 can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIGS. 3B, 4C and 6B. However, it is to be appreciated that systems may be designed to handle 450 millimeter wafers or substrate or, more particularly, 450 millimeter wafer or substrate carriers.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 700 described in association with FIG. 7 or with process tool 1000 described in association with FIG. 10. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

FIG. 11 illustrates a diagrammatic representation of a machine in the exemplary form of a computer system 1100 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations described herein.

The computer system 1100 may further include a network interface device 1108. The computer system 1100 also may include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1132 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits thereon or therein.

Thus, methods of and carriers for dicing semiconductor wafers, each wafer having a plurality of integrated circuits, have been disclosed.

What is claimed is:

1. A plasma etch chamber, comprising:
  a substrate support;
  a carrier and substrate assembly on and supported by the support, the carrier and substrate assembly comprising a backing tape surrounded by a frame, and a substrate supported by the backing tape; and
  a cover ring moveably positioned above the substrate support, the cover ring for protecting the carrier and substrate assembly during an etch process, wherein the cover ring comprises:
    an inner opening having a diameter smaller than the diameter of the substrate of the carrier and substrate assembly; and
    an outer frame surrounding the inner opening, the outer frame having a bevel for accommodating an outermost portion of the substrate of the carrier and substrate assembly during the etch process, wherein the bevel comprises an overhanging surface and a peripheral surface, wherein the overhanging surface of the bevel is for contacting an upper surface of the outermost portion of the substrate of the carrier and substrate assembly, wherein the peripheral surface of the bevel is sized and oriented to substantially face a peripheral surface of the outermost portion of the substrate of the carrier and substrate assembly but not contact the peripheral surface of the outermost portion of the substrate, wherein the peripheral surface of the bevel has a total height approximately the same as a total height of the substrate of the carrier and substrate assembly, and wherein the outer frame of the cover ring has an outermost diameter less than an innermost diameter of the frame of the carrier and substrate assembly, wherein the bevel of the cover ring further comprises a protruding sloped surface joining the overhanging surface and the peripheral surface of the bevel, and wherein the protruding sloped surface is for contacting a beveled surface of the outermost portion of the substrate of the carrier and substrate assembly.

2. The plasma etch chamber of claim 1, wherein the outer frame of the cover ring comprises a material substantially non-transmissive to ultraviolet radiation.

3. The plasma etch chamber of claim 1, wherein the outer frame of the cover ring comprises stainless steel.

4. The plasma etch chamber of claim 1, wherein the outer frame of the cover ring comprises a thermally resistant plastic.

5. A plasma etch chamber, comprising:
- a substrate support;
- a carrier and substrate assembly on and supported by the support, the carrier and substrate assembly comprising a backing tape surrounded by a frame, and a substrate supported by the backing tape; and
- a cover ring moveably positioned above the substrate support, the cover ring for protecting the carrier and substrate assembly during an etch process, wherein the cover ring comprises:
  - an inner opening having a diameter smaller than the diameter of the substrate of the carrier and substrate assembly; and
  - an outer frame surrounding the inner opening, the outer frame having a bevel for accommodating an outermost portion of the substrate of the carrier and substrate assembly during the etch process, wherein the bevel comprises an overhanging surface and a peripheral surface, and wherein the bevel of the cover ring further comprises a protruding sloped surface joining the overhanging surface and the peripheral surface of the bevel, and
    wherein the protruding sloped surface is for contacting a beveled surface of the outermost portion of the substrate of the carrier and substrate assembly.

6. The plasma etch chamber of claim 5, wherein the outer frame of the cover ring comprises a material substantially non-transmissive to ultraviolet radiation.

7. The plasma etch chamber of claim 5, wherein the outer frame of the cover ring comprises stainless steel.

8. The plasma etch chamber of claim 5, wherein the outer frame of the cover ring comprises a thermally resistant plastic.

* * * * *